US007319593B2

(12) United States Patent
Wilcox et al.

(10) Patent No.: US 7,319,593 B2
(45) Date of Patent: Jan. 15, 2008

(54) INDUSTRIAL LIGHT FIXTURE WITH SPRING-BRACKET OVER CAPACITOR

(75) Inventors: Kurt Wilcox, Libertyville, IL (US); Eric Haugaard, Kenosha, WI (US)

(73) Assignee: Ruud Lighting, Inc., Racine, WI (US)

( * ) Notice: Subject to any disclaimer, the term of this patent is extended or adjusted under 35 U.S.C. 154(b) by 54 days.

(21) Appl. No.: 11/196,046

(22) Filed: Aug. 3, 2005

(65) Prior Publication Data

US 2007/0081345 A1 Apr. 12, 2007

(51) Int. Cl.
*H05K 7/20* (2006.01)
*B60Q 1/06* (2006.01)
*F21V 15/00* (2006.01)

(52) U.S. Cl. ...................... 361/707; 361/704; 361/714; 362/373; 362/362

(58) Field of Classification Search ................ 362/294, 362/147, 264, 265, 362, 373; 361/707, 704, 361/714, 274.1–274.3
See application file for complete search history.

(56) References Cited

U.S. PATENT DOCUMENTS 2,460,903 A 2/1949 Peck
2,683,824 A 7/1954 Carville et al.
3,490,820 A 1/1970 Lewis
3,986,019 A * 10/1976 deVos et al. ................ 362/367
4,403,277 A * 9/1983 Eargle et al. ............... 362/263
5,016,139 A * 5/1991 Stopa et al. ................ 361/720
5,245,237 A 9/1993 Fisher et al.
5,493,158 A 2/1996 Daniels
5,927,843 A * 7/1999 Haugaard et al. ........... 362/147
6,057,615 A 5/2000 Long
6,367,945 B2 * 4/2002 Quiogue et al. ............ 362/147
6,394,869 B1 5/2002 Haugaard et al.
6,419,378 B1 * 7/2002 Wedell et al. .............. 362/431
6,467,927 B1 10/2002 Haugaard et al.
6,578,988 B2 * 6/2003 Johnson et al. ............. 362/294
6,601,975 B1 * 8/2003 Haugaard et al. ........... 362/362

* cited by examiner

*Primary Examiner*—Sandra O'Shea
*Assistant Examiner*—Sean P. Gramling
(74) *Attorney, Agent, or Firm*—Jansson Shupe & Munger Ltd.

(57) ABSTRACT

An industrial light fixture of the type including a housing with a base member and a top member and containing power-related components includes a spring-bracket secured to bracket-securement point(s), extending along the capacitor to hold the capacitor in place and biasing the capacitor into heat-exchange engagement against one surface of the top member to facilitate heat transfer from the capacitor to the top member and dissipation therefrom to the atmosphere. The base member and top member are preferably formed of die-cast metal and a variety of preferred features are disclosed.

33 Claims, 10 Drawing Sheets

INDUSTRIAL LIGHT FIXTURE WITH SPRING-BRACKET OVER CAPACITOR

FIELD

This field relates generally to industrial light fixtures, such as overhead industrial light fixtures, and more specifically to such overhead industrial light fixtures having high-intensity discharge lamps.

BACKGROUND

Many different overhead industrial light fixtures exist to serve needs such as factory and warehouse illumination and the like, and a number of advances have been made over the years. Among significant advances in industrial light fixtures are the fixtures disclosed in U.S. Pat. No. 6,601,975 (Overhead Industrial Light Fixture With Two-Piece Housing); U.S. Pat. No. 6,394,869 (Method for Manufacture of Overhead Industrial Light Fixture); and U.S. Pat. No. 6,467,927 (Overhead Industrial Light Fixture With Mounted Reflector), all of Ruud Lighting, Inc. Such fixtures provide significant advantages, including compactness, simplicity of manufacture, ease of installation and service, pleasing appearance, and other advantages set forth in the disclosures.

Despite these and other such advances in the field there remains a need for further improvement in industrial light fixtures, preferably without compromising the advantages previously provided including those related to ease of manufacture, storage, shipment, installation, etc.

One concern of particular significance is that overhead industrial light fixtures of the prior art are predisposed to a variety of problems associated with overheating. Overheating can damage power-related components (e.g., capacitors) which ultimately compromises the longevity of the light fixture and its components. Among the overheating problems with certain devices of the prior art is a problem of inadequate heat dissipation away from power-related components, such as ballasts, lamps and lamp sockets.

Another problem is that certain structures of the prior art may not be particularly well-adapted to suppress and/or contain any combustion that might occur. In certain cases, the nature of the ballast (including manufacturing defects or minimal defects that may occur from handling or the like) or improper electrical characteristics or conditions can lead to ballast failures and shorts which in turn lead to combustion of materials (e.g., organic insulation materials). As can be seen, the goals of achieving cooling and suppressing oxidation in an industrial light fixture tend to be at odds with each other. Accomplishing one of these critical goals tends to lead to loss of the other. The benefits realized in being able to accomplish these two goals in one fixture would be significant.

For one thing, facilitating cooling of the industrial light fixture tends to keep the components cool thereby enhancing the life of the components and the entire fixture and preserving overall quality. And, substantially reducing the inflow and outflow of combustion-supporting air in critical portions of an industrial light fixture would tend to suppress and limit any combustion which might occur, and thus reduce dangers typically associated with product failures. If these critical advantages could be combined in an industrial lighting fixture, the resulting fixture would have improved quality, endurance and longevity.

One of the power-related components, the capacitor, is particularly susceptible to damage from overheating. In industrial light fixtures, heat from ballasts, HID lamps, and lamp sockets are particular sources of significant heat, and heat from such elements, often in situations involving high ambient temperatures, can tend to lead to capacitor malfunction and deterioration. It is dealing with this particular concern that is the subject of this invention.

The invention relates to improved apparatus for achieving enhanced heat dissipation from the capacitor to the atmosphere, while at the same time discouraging and suppressing any combustion that might occur in the industrial light fixture.

OBJECTS

It is an object to provide an improved industrial light fixture overcoming some of the problems and shortcomings of the prior art.

Another object is to provide an industrial light fixture which facilitates dissipation of heat from the housing of the overhead industrial light fixture into the atmosphere.

Another object is to provide an industrial light fixture which isolates the capacitor from other heat-generating components of the housing.

Another object is to provide an industrial light fixture which is less susceptible to combustion.

Another object is to provide an industrial light fixture which is well-adapted to contain any combustion that might occur.

Another object is to provide an improved industrial light fixture that is inexpensive to manufacture and easy to install.

Still another object is to provide an improved industrial light fixture which is compact and yet free of problems of overheating critical components.

SUMMARY

This subject matter described herein is an improvement in an overhead industrial light fixtures of the type including a housing, power-related components and a lamp-mounting socket. The type of overhead industrial light fixture to which this improvement applies has a housing, a base member and a top member together forming a space, power-related components, including at least a capacitor, in the space on the base member, and a lamp-mounting socket.

In the improvement, the base member has first and second ends and the top member has first and second endwalls aligned therewith, respectively. A capacitor bed is on the base member and adjacent to the second end. The capacitor has a capacitor outward surface, adjacent to the second endwall, and an opposite capacitor inward surface. Also in the improvement, there is at least one bracket-securement point on the base member spaced from the second end. A spring-bracket is secured to the bracket-securement points, extending along the capacitor inward surface and from there over the capacitor to hold the capacitor in place. The spring-bracket biases the capacitor outward surface into heat-exchange engagement against the second endwall. This facilitates heat transfer from the capacitor to the top member and dissipation therefrom to the atmosphere.

In highly preferred embodiments, both the base member and the top member are formed of die-cast metal. In particularly preferred die-cast structures, the base member and top member are configured to provide mating engagement thereby forming a substantially enclosed space.

The capacitor is preferably of the type having a projection bead thereabout. The second endwall has a groove on its inner surface positioned to receive the bead and thereby facilitate full contact of the capacitor outward surface with the inner surface of the second endwall.

In highly preferred embodiments, the spring-bracket is a leaf-spring member having a proximal end portion that is secured to the bracket-securement point(s). The leaf-spring member extends from the proximal end portion along a resilient length thereof to a free distal end thereof. Each bracket-securement point is preferably on a raised portion of the base member. For each bracket-securement point the proximal end portion of the leaf-spring member includes a tab engaging the bracket-securement point.

In such preferred embodiments, the leaf-spring member has at least two selectable tabs vertically offset from one another as positions accommodating the mounting of capacitors of two different standard sizes such that either selected standard-size capacitor will be biased into heat-exchange engagement against the second endwall. In such improvement, a pair of horizontally-spaced bracket-securement points and two selectable pairs of tabs is each vertically offset from the other pair.

In certain highly preferred embodiments, the top member is hinged with the respect to the base member such that hinging motion of the top member upon closing the housing pushes the capacitor against the biasing of the spring-bracket to obtain the heat-exchange engagement of the capacitor outward surface against the second endwall. The first end of the base member has a base hinge member integrally formed therewith. And the first endwall of the top member has an endwall hinge member in mating engagement with the base hinge member.

As used herein, the following terms have the meanings given below, unless the context requires otherwise:

In referring to an overhead industrial light fixture, the term "overhead" refers to fixtures which are typically mounted, directly or indirectly, on ceilings or overhead structural members of some sort, such as in factories, warehouses, etc. (regardless of purpose), or any other overhead structure put in place for the purpose of supporting a light fixture. The term "industrial" is used in order to differentiate from residential lighting or the like. Neither of these terms is to be taken as limiting.

The term "power-related components" includes ballasts, capacitors, ignitors and other devices for creating the proper electrical operating characteristics usable for a selected lamp, such as high-intensity discharge (HID) lamps of various kinds.

The term "ballast" as used herein is defined as a power regulating device commonly referred to as, for example, a ballast, a high reactant ballast, or a constant wattage auto transformer, etc.

The term "substantially enclosed," as used with respect to space within the housing, means closed in the sense that inflow and outflow of air are impeded even if the space is not fully sealed. The impeding of air flow is such as would serve to suppress combustion if it were to occur.

The terms "top" and "base" used herein with reference to the fixture, or parts thereof, assume the normal use orientation of the fixture. The simplicity of the housing retains certain advantages, including ease of manufacturing and service, compactness, pleasing in appearance, and ease of assembly, as disclosed in U.S. Pat. No. 6,394,869 (Method For Manufacture of Overhead Light Fixture)

The overhead industrial light fixture described herein, in its various forms, overcomes certain problems and shortcomings of the prior art, including those referred to above.

BRIEF DESCRIPTION OF THE DRAWINGS

The drawings illustrate preferred embodiments which include the above-noted characteristics and features of the invention. The invention will be readily understood from the descriptions and from the drawings, in which.

DETAILED DESCRIPTION OF PREFERRED EMBODIMENTS

Figure 1:
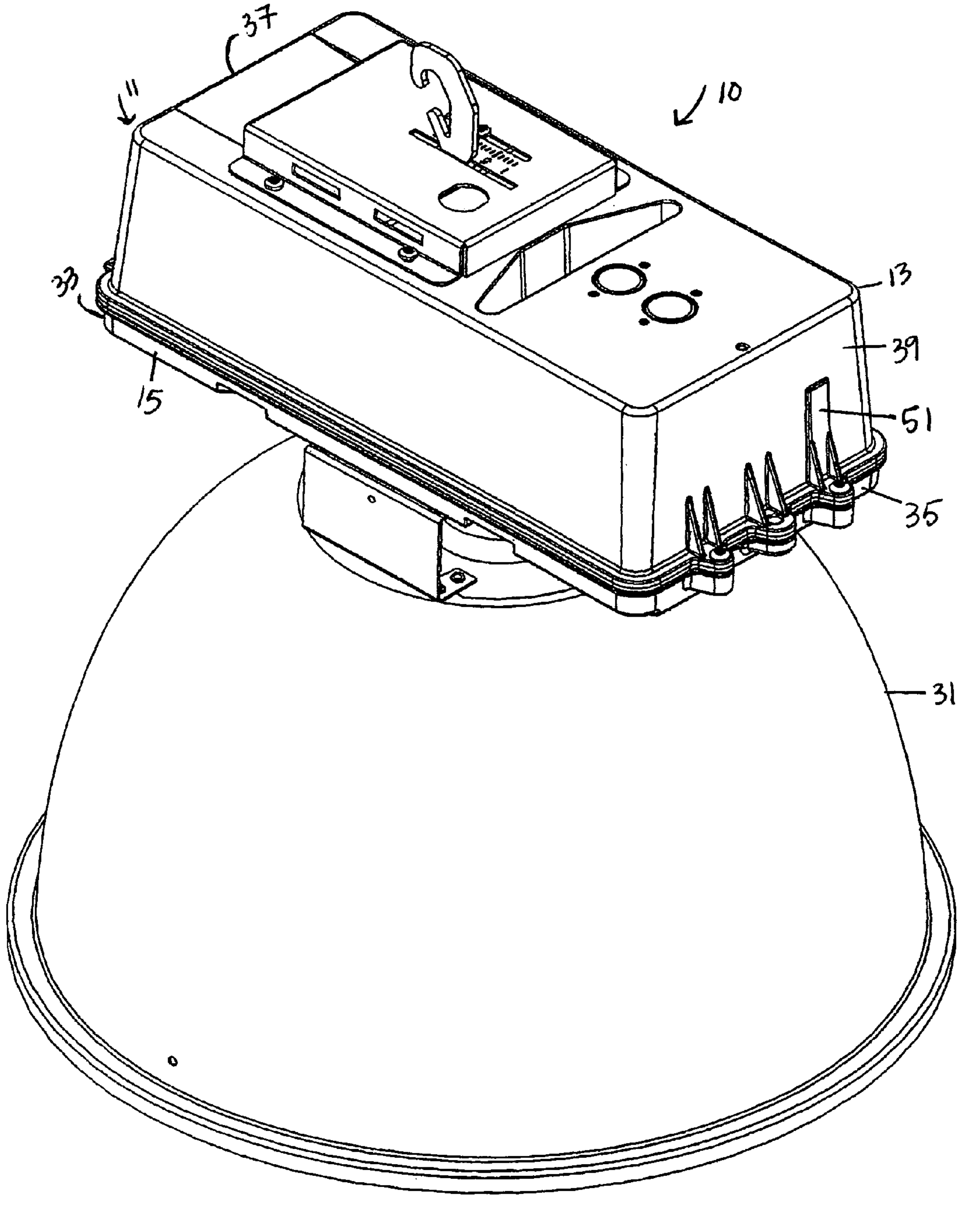
FIG. 1 is a perspective view of a preferred industrial light fixture in accordance with this invention.

The drawings illustrate an overhead industrial light fixture 10 which includes: a housing 11 with a top member 13 and a base member 15; power-related components, including a ballast 17, a capacitor 19, and an ignitor 21; spring-spacer apparatus 23; a spring-bracket 25; a socket mount 27; a lamp-mounting socket 29; and a reflector 31. Such elements are best seen in FIGS. 1 and 2.

Figure 2:
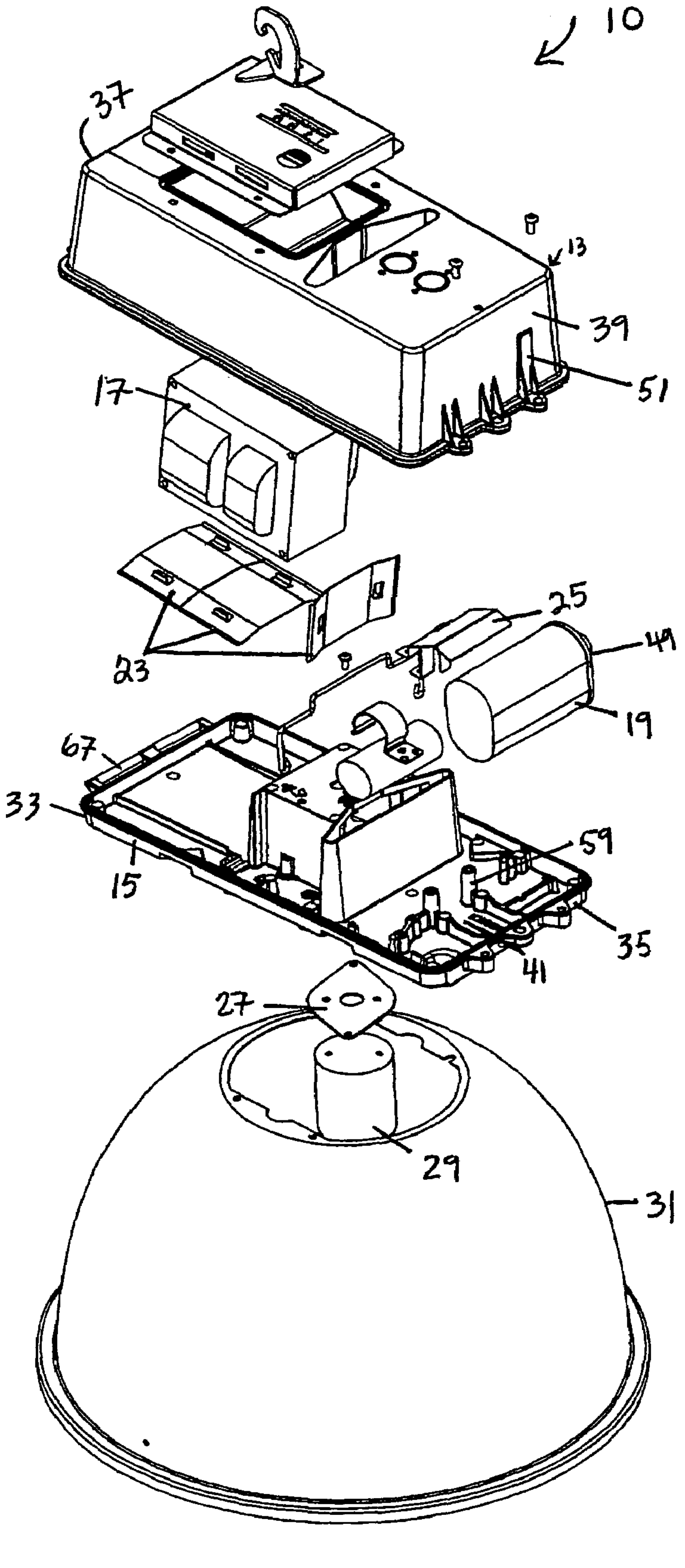
FIG. 2 is an exploded perspective view of the device of FIG. 1.
Figure 3:
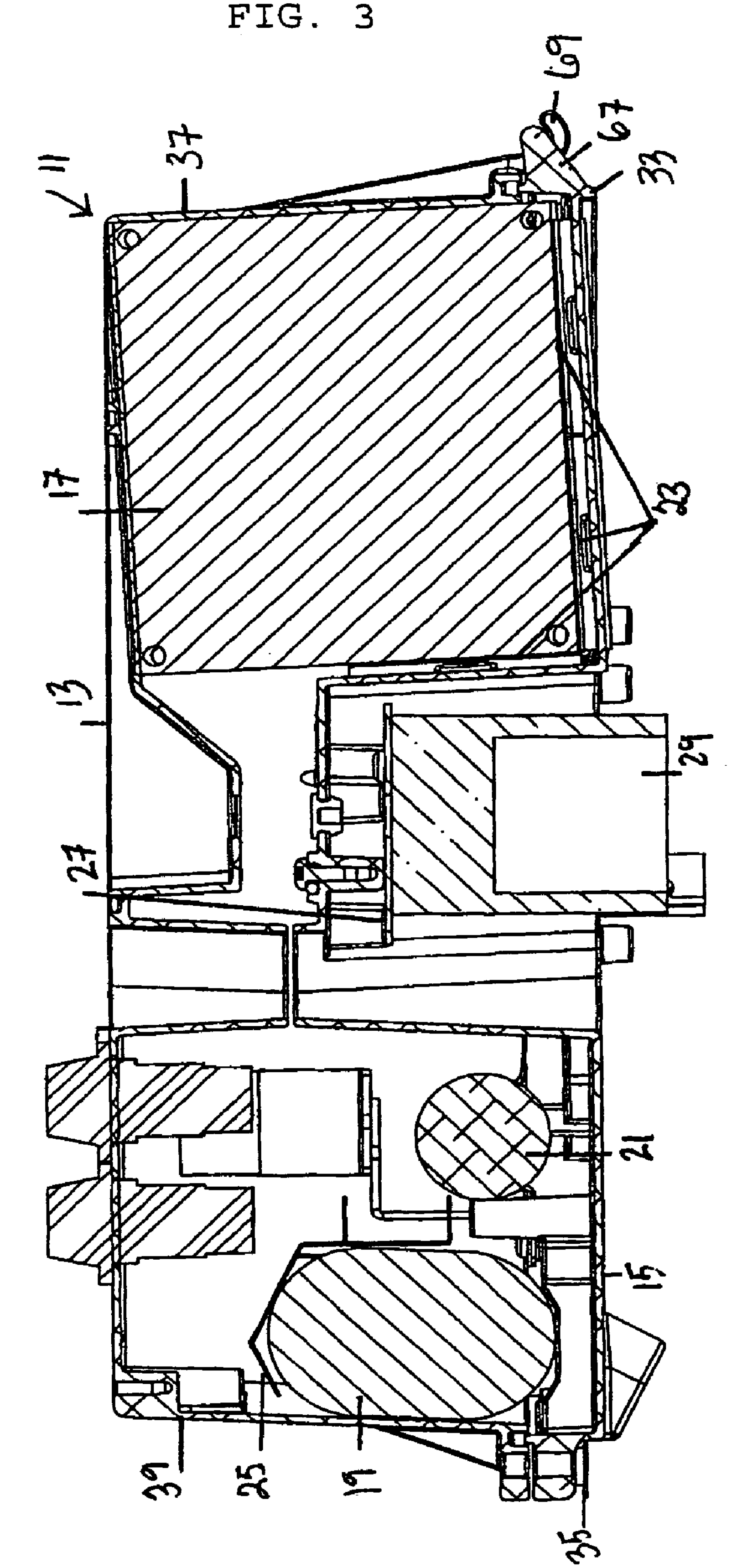
FIG. 3 is cross-section of the housing of the device in FIG. 1.
Figure 4:
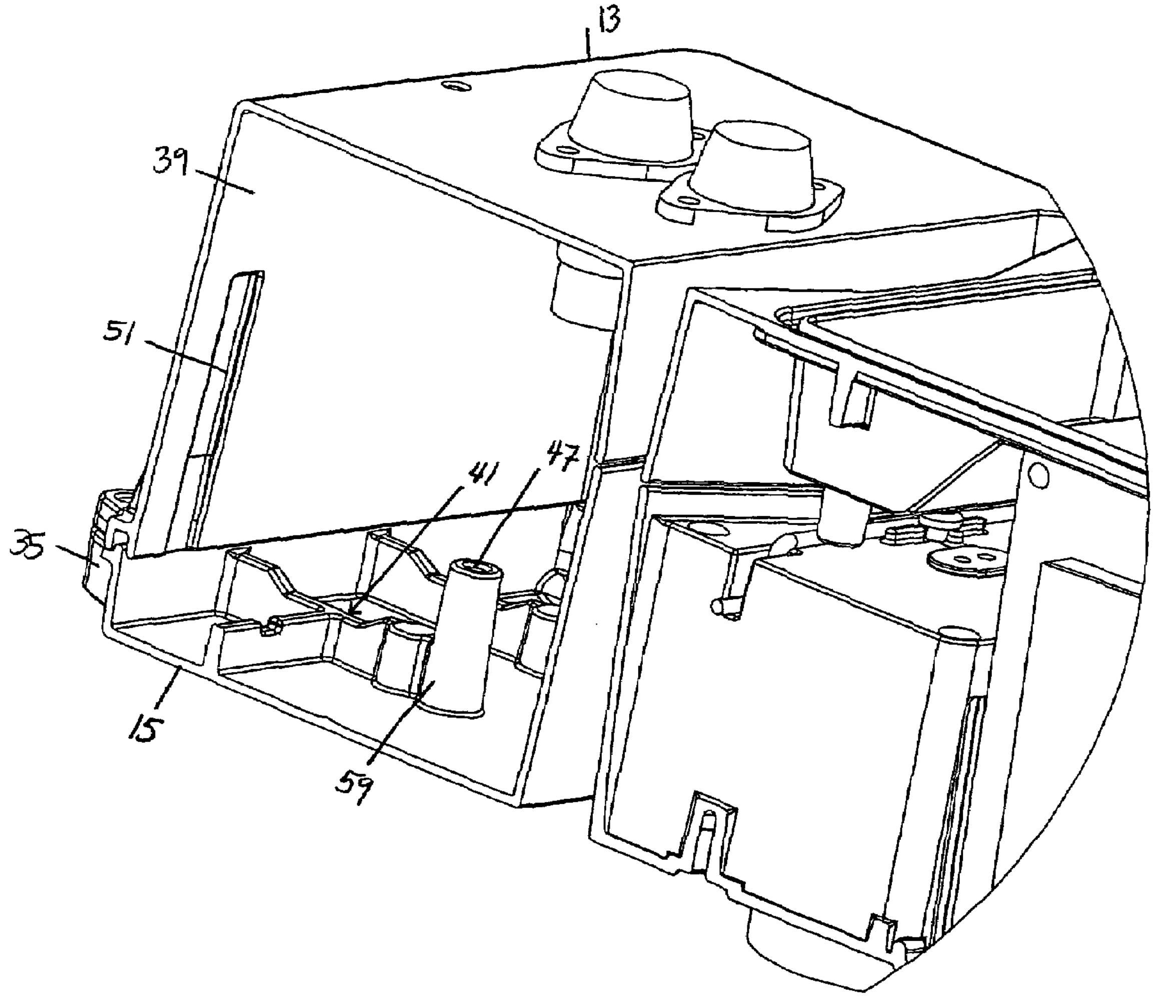
FIG. 4 is a partial cross-section of the housing of the device of FIG. 1.

As seen in FIGS. 1 and 3, in one aspect of the invention base member 15 and top member 13, each formed of die-cast metal, are configured to provide mating engagement thereby forming a substantially enclosed space while allowing essentially unrestricted inflow and outflow of air to cool power-related components in housing 11.

Referring to FIGS. 3-9, in another aspect of the invention base member 15 has first and second ends, 33 and 35 respectively, and top member 13 has first and second endwalls, 37 and 39 respectively, aligned therewith. A capacitor bed 41 is positioned on base member 15 adjacent second end 35. Capacitor 19, on capacitor bed 41, has a capacitor outward surface 43 adjacent to second endwall 39 and an opposite capacitor inward surface 45. There is at least one bracket-securement point 47 on base member 15 spaced from second end 35. And, spring-bracket 25 is secured to bracket-securement point(s) 47 and extends along capacitor inward surface 45 and from there over capacitor 19 to hold capacitor 19 in place. Spring-bracket 25 further biases capacitor outward surface 43 into heat-exchange engagement against second endwall 39 to facilitate heat transfer from capacitor 19 to top member 13 and dissipation therefrom to the atmosphere.

Figure 10:
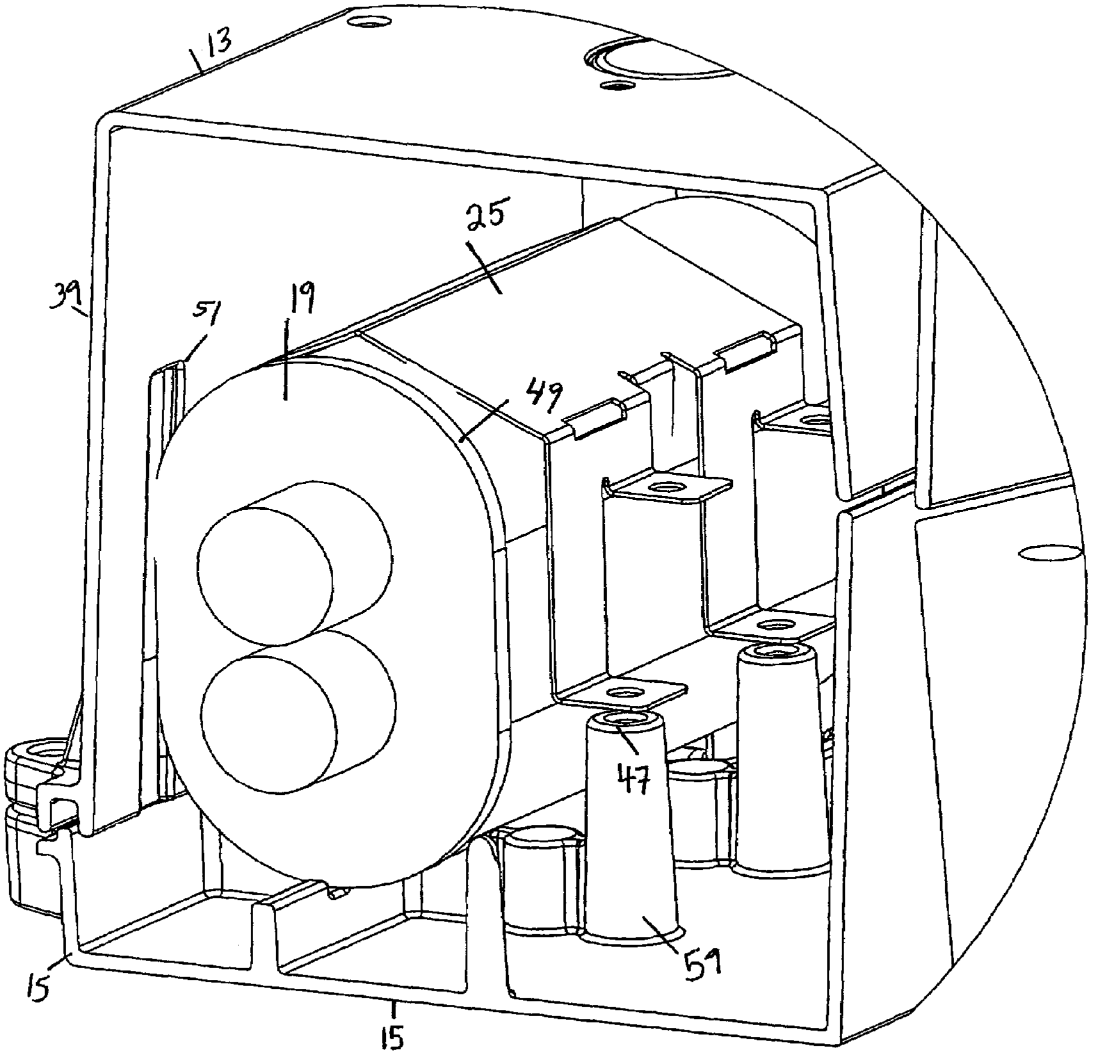
FIG. 10 is a partial cross-section of the housing of the device of FIG. 1, illustrating a standard size capacitor.
Figure 12:
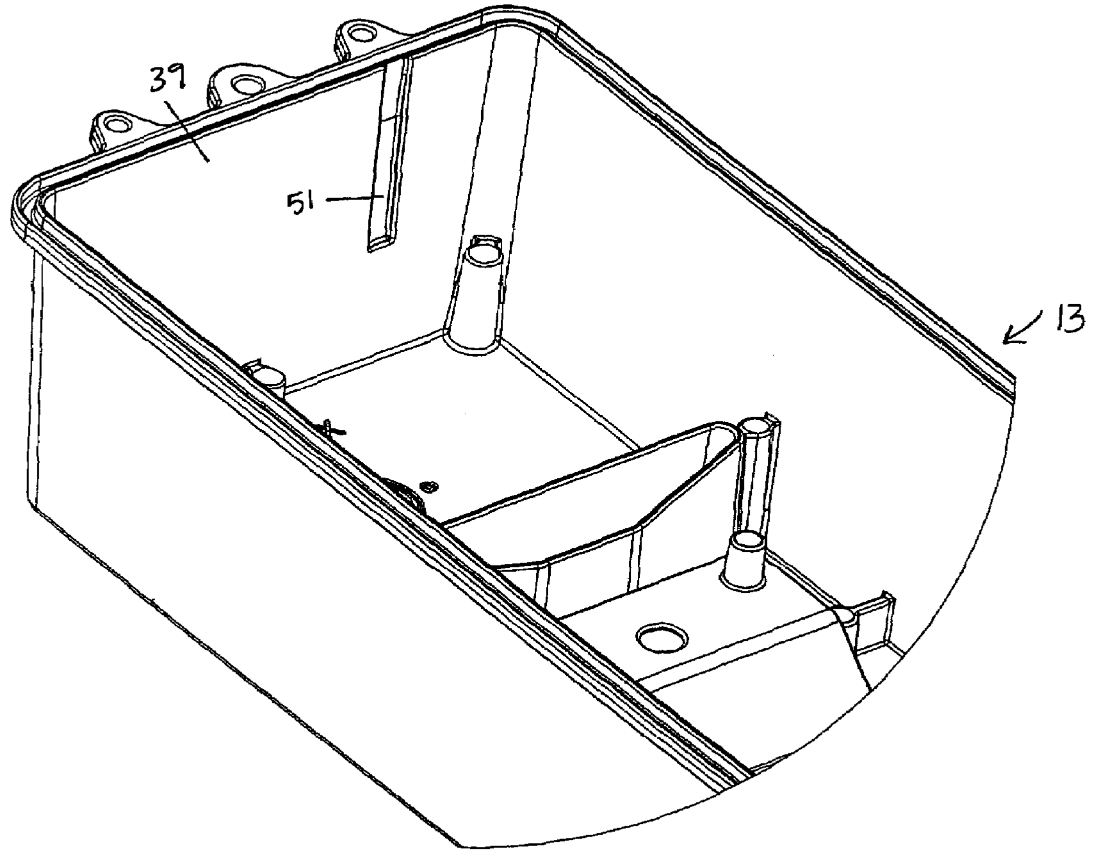
FIG. 12 is an alternate perspective partial view of the top member of the housing of the device of FIG. 1.

In one aspect of the invention, as seen in FIGS. 10 and 12, capacitor 19 is of the type having a projecting bead 49 thereabout. Second endwall 39 has a groove 51 on its inner surface positioned to receive bead 49 and thereby facilitate full contact of capacitor outward surface 43 with inner surface of second wall 39.

Figure 6:
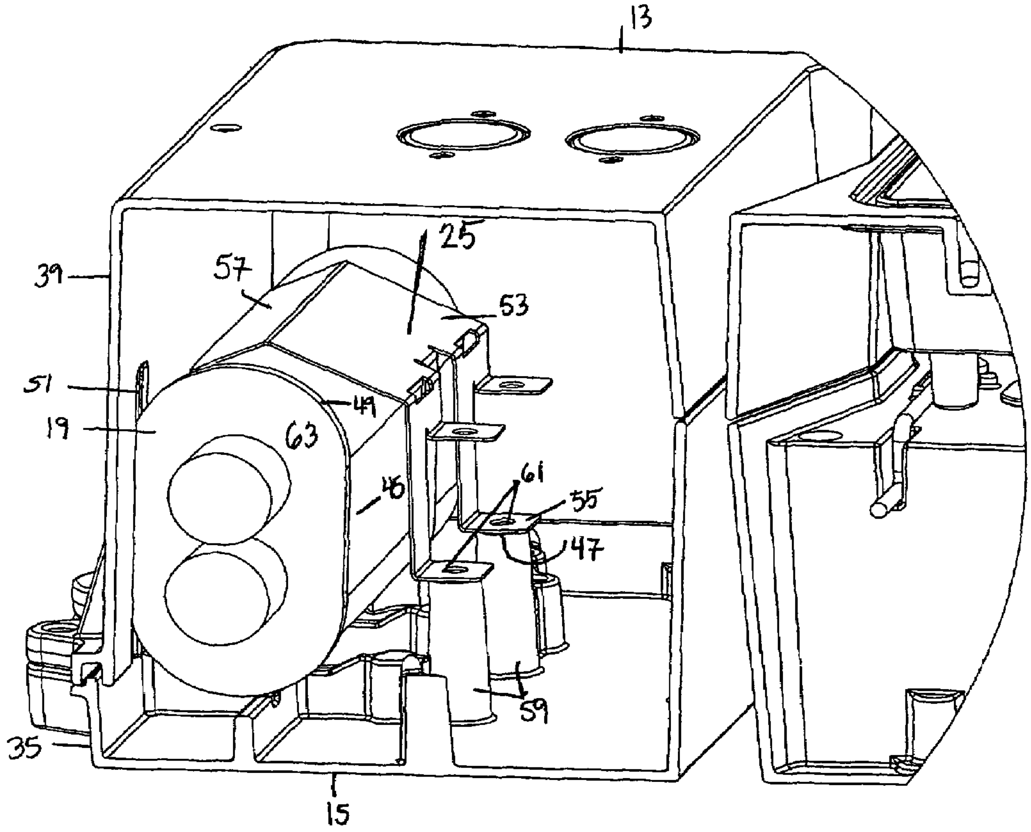
FIG. 6 is a partial cross-section of the housing of the device in FIG. 1
Figure 7:
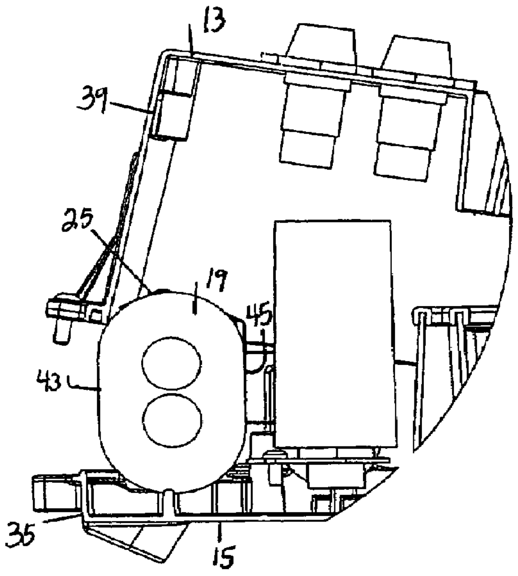
FIG. 7 is another partial cross-section of the housing of the device in FIG. 1.
Figure 8:
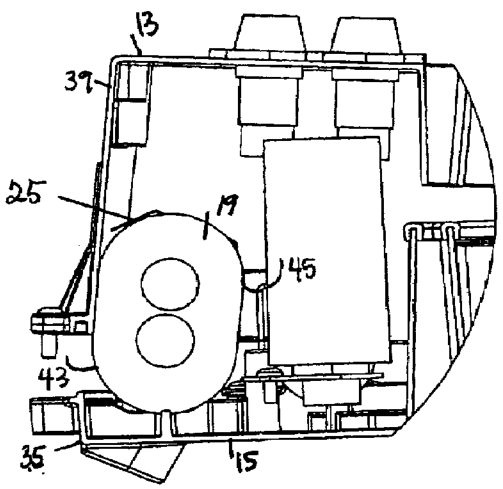
FIG. 8 is further partial cross-section of the housing of the device in FIG. 1.
Figure 9:
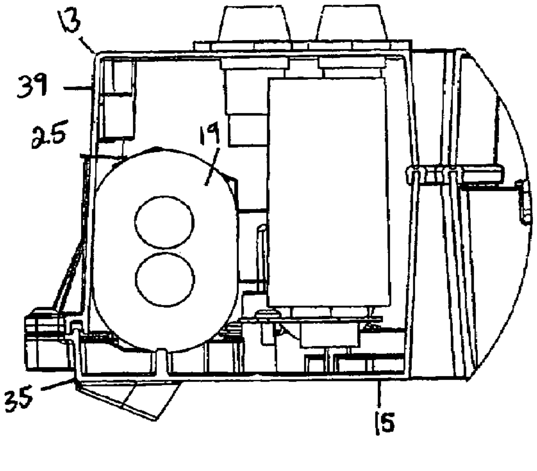
FIG. 9 is yet another partial cross-section of the housing of the device in FIG. 1.

As best seen in FIG. 6, one embodiment of the invention is shown wherein spring-bracket 25 is a leaf-spring member 53 having a proximal end portion 55 that is secured to bracket-securement point(s) 47 and extending from proximal end portion 55 along a resilient length thereof to a free distal end 57 thereof. Each bracket-securement point 47 is on a raised portion 59 of base member 15. For each bracket-securement point 47 proximal end portion 55 of leaf-spring member 53 includes a tab 61 engaging bracket-securement point 47.

Figure 11:
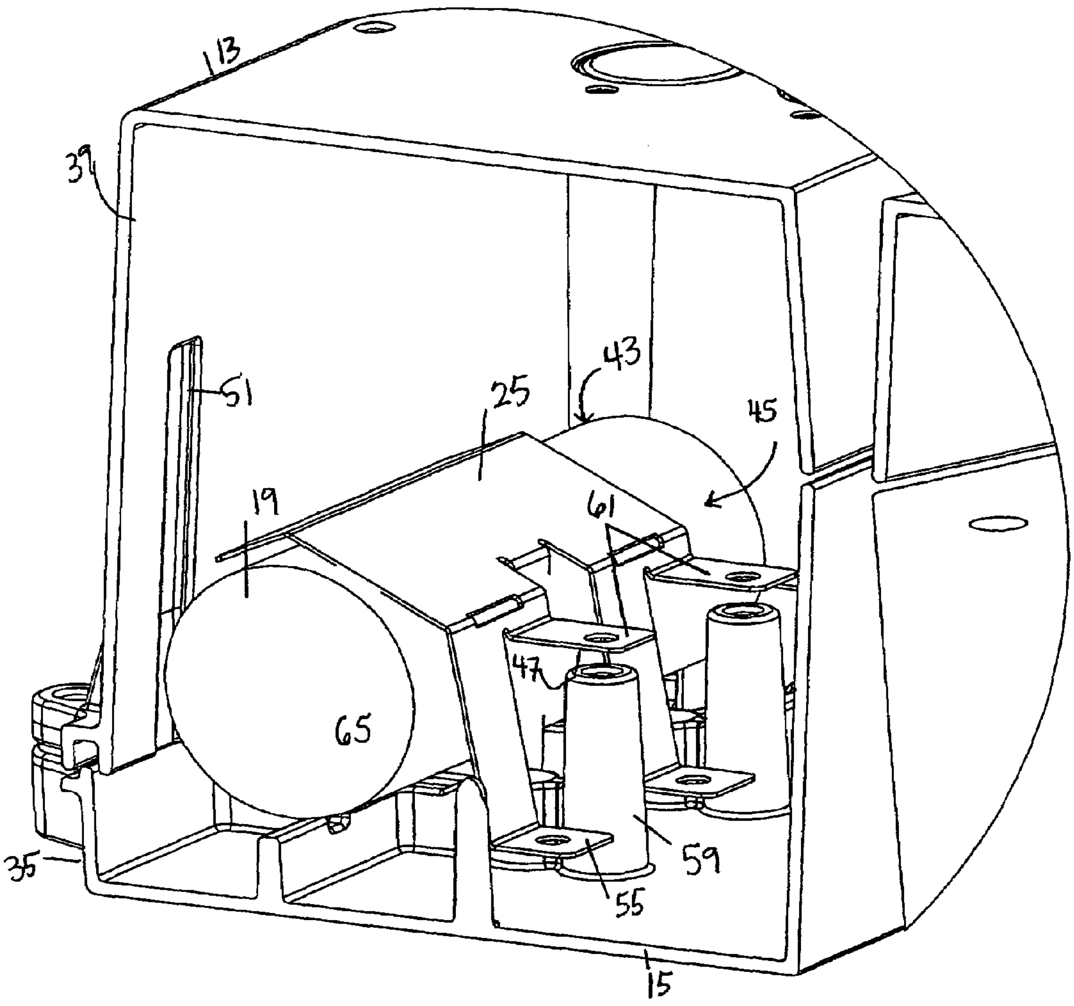
FIG. 11 is further partial cross-section of the housing of the device of FIG. 1, illustrating yet another standard size capacitor.

Referring now to FIGS. 10 and 11, in one aspect of the invention leaf-spring member 53 has at least two selectable tabs 61 vertically offset from one another at positions accommodating the mounting of capacitors of two different standard sizes, 63 and 65, such that either selected standard-size capacitor will be biased into heat-exchange engagement against second endwall 39.

Overhead industrial light fixture 10 includes a horizontally-spaced pair of bracket-securement points 47 and two selectable pairs of tabs 61, each pair vertically off from the other pair.

Figure 5:
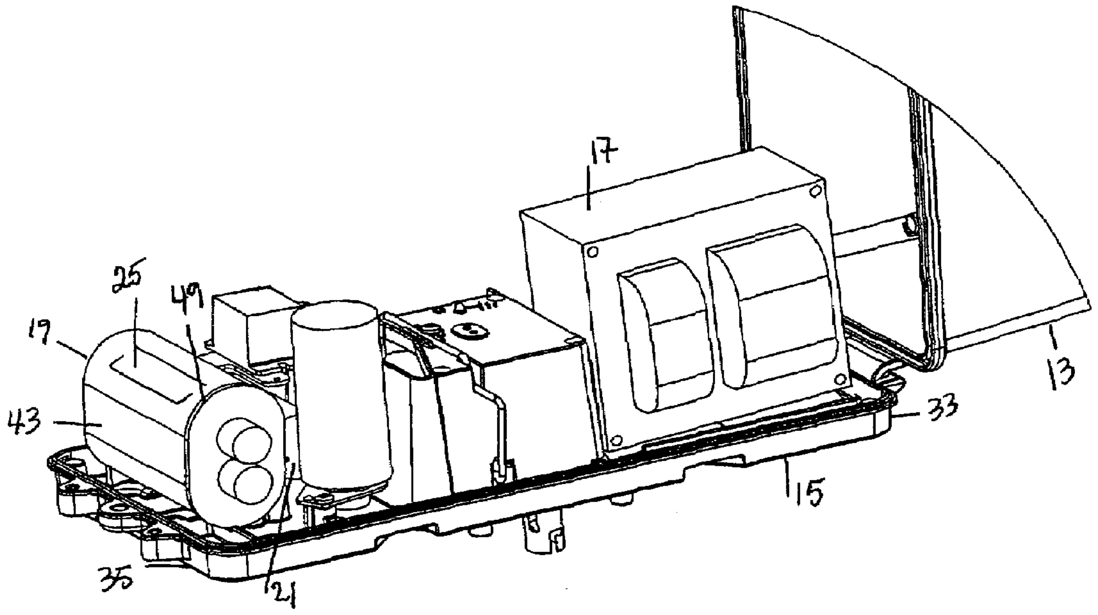
FIG. 5 is a top perspective view of the base member of the housing of the device of FIG. 1.

Referring next to FIGS. 3 and 5, an embodiment is shown where top member 13 is hinged with respect to base member 15 such that hinging motion of top member 13 upon closing of housing 11 pushes capacitor 19 against the biasing of spring-bracket 25 to obtain the heat-exchange engagement of capacitor outward surface 43 against second endwall 39.

First end 33 of base member 15 has a base hinge member 67 integrally formed therewith. First endwall 37 of top member 13 has an endwall hinge member 69 in mating engagement with base hinge member 67.

Before assembly, top member 13 and base member 15 are formed of die-cast metal. Ballast 17 is placed at its assigned location and is secured to spring-spacer apparatus 23. Capacitor 19 is positioned at its assigned location on capacitor bed 41 and is secured to base member 15 by spring-bracket 25.

Socket mount 27 is secured with respect to base member 15. Socket mount 27 supports lamp-mounting socket 29 within housing 11.

Assembly continues by hingedly connecting top member 13 to base member 15. Base member 15 is then secured to top member 13 by a base hinge member 67 in mating engagement with endwall hinge member 69 of first endwall 37. This substantially completes assembly of light fixture 10.

Reflector 31 can be attached to light fixture 10 while preparing for installation at a job site. In some cases, however, reflector 31 may be attached to light fixture 10 immediately upon completion of attachment of base member 15 to top member 13.

When assembly is completed, light fixture 10 is ready for packaging and shipment.

The die-cast metal used in forming top member 13 and bottom member 15 is preferably aluminum. Acceptable power-related components and other components used in manufacture of light fixture 10 are known to those skilled in the art.

The low profile which is made possible by recessing socket 29 into housing 11 allows the vertical dimension of housing 11 to be as low as 4.5 to 6 inches, even when using electrical components which are standard in overhead industrial light fixtures.

While the principles of this invention have been described in connection with specific embodiments, it should be understood clearly that these descriptions are made only by way of example and are not intended to limit the scope of the invention.

The invention claimed is:

1. In an industrial light fixture of the type having: a housing with a base member and a top member together forming a space; power-related components in the space on the base member, including at least a capacitor; and a lamp-mounting socket, the improvement comprising:

the base member having first and second ends and the top member having first and second endwalls aligned therewith, respectively;

a capacitor bed on the base member adjacent to the second end;

a capacitor on the capacitor bed, the capacitor having a capacitor outward surface adjacent to the second endwall and an opposite capacitor inward surface, the capacitor being of the type having a projecting bead thereabout;

the second endwall having a groove on its inner surface positioned to receive the bead;

at least one bracket-securement point on the base member spaced from the second end; and a spring-bracket (a) secured to the bracket-securement point(s), (b) extending along the capacitor inward surface and from there over the capacitor to hold the capacitor in place, and (c) biasing the capacitor outward surface into full heat-exchange engagement against the inner surface of the second endwall to facilitate heat transfer from the capacitor to the top member and dissipation therefrom to the atmosphere.

2. The industrial light fixture of claim 1 wherein the base member and the top member are each of die-cast metal.

3. The industrial light fixture of claim 1 wherein the base member and the top member are configured to provide mating engagement thereby forming a substantially enclosed space.

4. The industrial light fixture of claim 1 wherein the spring-bracket is a leaf-spring member having a proximal end portion that is secured to the bracket-securement point (s) and extending from the proximal end portion along a resilient length thereof to a free distal end thereof.

5. The industrial light fixture of claim 4 wherein:

each bracket-securement point is on a raised portion of the base member; and for each bracket-securement point the proximal end portion of the leaf-spring member includes a tab engaging the bracket-securement point.

6. The industrial light fixture of claim 5 wherein the leaf-spring member has at least two selectable tabs vertically offset from one another at positions accommodating the mounting of capacitors of two different standard sizes such that either selected standard-size capacitor will be biased into heat-exchange engagement against the second endwall.

7. The industrial light fixture of claim 4 comprising:

a horizontally-spaced pair of the bracket-securement points; and two selectable pairs of tabs, each pair vertically offset from the other pair.

8. The industrial light fixture of claim 1 wherein the top member is hinged with respect to the base member such that hinging motion of the top member upon closing the housing pushes the capacitor against the biasing of the spring-bracket to obtain the heat-exchange engagement of the capacitor outward surface against the second endwall.

9. The industrial light fixture of claim 8 wherein:

the first end of the base member has a base hinge member integrally formed therewith; and the first endwall of the top member has an endwall hinge member in mating engagement with the base hinge member.

10. The industrial light fixture of claim 9 wherein the base member and the top member are each of die-cast metal.

11. The industrial light fixture of claim 10 wherein the base member and the top member are configured to provide mating engagement thereby forming a substantially enclosed space.

12. In an industrial light fixture of the type having: a housing with a base member and a top member together forming a space; power-related components in the space on the base member, including at least a first principal heat-restricted power-related component; and a lamp-mounting socket, the improvement comprising:

the base member having first and second ends and the top member having first and second endwalls aligned therewith, respectively;

a first principal heat-restricted power-related component bed on the base member adjacent to the second end;

a first principal heat-restricted power-related component on the first principal heat-restricted power-related component bed, the first principal heat-restricted power-related component having a first principal heat-restricted power-related component outward surface adjacent to the second endwall and an opposite first principal heat-restricted power-related component inward surface, the first principal heat-restricted power-related component being of the type having a projecting bead thereabout;

the second endwall having a groove on its inner surface positioned to receive the bead;

at least one bracket-securement point on the base member spaced from the second end; and a spring-bracket (a) secured to the bracket-securement point(s), (b) extending along the first principal heat-restricted power-related component inward surface and from there over the first principal heat-restricted power-related component to hold the first principal heat-restricted power-related component in place, and (c) biasing the first principal heat-restricted power-related component outward surface into heat-exchange engagement against the inner surface of the second endwall to facilitate heat transfer from the first principal heat-restricted power-related component to the top member and dissipation therefrom to the atmosphere.

13. In an industrial light fixture of the type having: a housing with a base member and a top member together forming a space; power-related components in the space on the base member, including at least a capacitor; and a lamp-mounting socket, the improvement comprising:

the base member having first and second ends and the top member having first and second endwalls aligned therewith, respectively;

a capacitor bed on the base member adjacent to the second end;

a capacitor on the capacitor bed, the capacitor having a capacitor outward surface adjacent to the second endwall and an opposite capacitor inward surface;

at least one bracket-securement point on the base member spaced from the second end, the bracket-securement points comprising a horizontally-spaced pair of the bracket-securement points and two selectable pairs of tabs, each pair vertically offset from the other pair; and a spring-bracket comprising a leaf-spring member having a proximal end portion (a) secured to the bracket-securement point(s), (b) extending from the proximal end portion along a resilient length thereof to a free distal end thereof to hold the capacitor in place, and (c) biasing the capacitor outward surface into heat-exchange engagement against the second endwall to facilitate heat transfer from the capacitor to the top member and dissipation therefrom to the atmosphere.

14. The industrial light fixture of claim 13 wherein the base member and the top member are each of die-cast metal.

15. The industrial light fixture of claim 13 wherein the base member and the top member are configured to provide mating engagement thereby forming a substantially enclosed space.

16. The industrial light fixture of claim 13 wherein:

the capacitor is of the type having a projecting bead thereabout; and the second endwall has a groove on its inner surface positioned to receive the bead and thereby facilitate full contact of the capacitor outward surface with the inner surface of the second endwall.

17. The industrial light fixture of claim 13 wherein:

each bracket-securement point is on a raised portion of the base member; and for each bracket-securement point the proximal end portion of the leaf-spring member includes a tab engaging the bracket-securement point.

18. The industrial light fixture of claim 17 wherein the leaf-spring member has at least two selectable tabs vertically offset from one another at positions accommodating the mounting of capacitors of two different standard sizes such that either selected standard-size capacitor will be biased into heat-exchange engagement against the second endwall.

19. The industrial light fixture of claim 13 wherein the top member is hinged with respect to the base member such that hinging motion of the top member upon closing the housing pushes the capacitor against the biasing of the spring-bracket to obtain the heat-exchange engagement of the capacitor outward surface against the second endwall.

20. The industrial light fixture of claim 19 wherein:

the first end of the base member has a base hinge member integrally formed therewith; and the first endwall of the top member has an endwall hinge member in mating engagement with the base hinge member.

21. The industrial light fixture of claim 20 wherein the base member and the top member are each of die-cast metal.

22. The industrial light fixture of claim 21 wherein the base member and the top member are configured to provide mating engagement thereby forming a substantially enclosed space.

23. In an industrial light fixture of the type having: a housing with a base member and a top member together forming a space; power-related components in the space on the base member, including at least a capacitor; and a lamp-mounting socket, the improvement comprising:

the top member being hinged with respect to the base member;

the base member having first and second ends and the top member having first and second endwalls aligned therewith, respectively;

a capacitor bed on the base member adjacent to the second end;

a capacitor on the capacitor bed, the capacitor having a capacitor outward surface adjacent to the second endwall and an opposite capacitor inward surface;

at least one bracket-securement point on the base member spaced from the second end; and a spring-bracket (a) secured to the bracket-securement point(s), (b) extending along the capacitor inward surface and from there over the capacitor to hold the capacitor in place, and (c) biasing the capacitor outward surface into heat-exchange engagement against the second endwall, such that hinging motion of the top member upon closing the housing pushes the capacitor against the biasing of the spring-bracket to obtain the heat-exchange engagement of the capacitor outward surface against the second endwall whereby heat transfer from the capacitor to the top member and dissipation therefrom to the atmosphere is facilitated.

24. The industrial light fixture of claim 23 wherein the base member and the top member are each of die-cast metal.

25. The industrial light fixture of claim 23 wherein the base member and the top member are configured to provide mating engagement thereby forming a substantially enclosed space.

26. The industrial light fixture of claim 23 wherein:

the capacitor is of the type having a projecting bead thereabout;

the second endwall has a groove on its inner surface positioned to receive the bead and thereby facilitate full contact of the capacitor outward surface with the inner surface of the second endwall.

27. The industrial light fixture of claim 23 wherein the spring-bracket is a leaf-spring member having a proximal end portion that is secured to the bracket-securement point (s) and extending from the proximal end portion along a resilient length thereof to a free distal end thereof.

28. The industrial light fixture of claim 27 wherein:

each bracket-securement point is on a raised portion of the base member; and for each bracket-securement point the proximal end portion of the leaf-spring member includes a tab engaging the bracket-securement point.

29. The industrial light fixture of claim 28 wherein the leaf-spring member has at least two selectable tabs vertically offset from one another at positions accommodating the mounting of capacitors of two different standard sizes such that either selected standard-size capacitor will be biased into heat-exchange engagement against the second endwall.

30. The industrial light fixture of claim 27 comprising:

a horizontally-spaced pair of the bracket-securement points; and two selectable pairs of tabs, each pair vertically offset from the other pair.

31. The industrial light fixture of claim 23 wherein:

the first end of the base member has a base hinge member integrally formed therewith; and the first endwall of the top member has an endwall hinge member in mating engagement with the base hinge member.

32. The industrial light fixture of claim 31 wherein the base member and the top member are each of die-cast metal.

33. The industrial light fixture of claim 32 wherein the base member and the top member are configured to provide mating engagement thereby forming a substantially enclosed space.

* * * * *